United States Patent [19]
Rogers et al.

[11] Patent Number: 5,828,610
[45] Date of Patent: Oct. 27, 1998

[54] LOW POWER MEMORY INCLUDING SELECTIVE PRECHARGE CIRCUIT

[75] Inventors: Robert Rogers, Sunnyvale; Kuang Kai Chi, San Jose, both of Calif.

[73] Assignee: Seiko Epson Corporation, Tokyo, Japan

[21] Appl. No.: 828,571

[22] Filed: Mar. 31, 1997

[51] Int. Cl.$^6$ .................................. G11C 7/00; G11C 8/00
[52] U.S. Cl. .................... 365/203; 365/189.02; 365/227; 365/230.02; 365/230.06
[58] Field of Search .................... 365/203, 154, 365/156, 189.02, 189.08, 190, 226, 227, 230.02, 230.06

[56] References Cited

U.S. PATENT DOCUMENTS

| | | | |
|---|---|---|---|
| 4,932,001 | 6/1990 | Chow et al. | 365/203 |
| 5,293,342 | 3/1994 | Casper et al. | 365/203 |
| 5,313,434 | 5/1994 | Abe | 365/203 |
| 5,349,560 | 9/1994 | Suh et al. | 365/203 |
| 5,357,474 | 10/1994 | Matano et al. | 365/203 |
| 5,400,283 | 3/1995 | Raad | 365/203 |
| 5,438,548 | 8/1995 | Houston | 365/227 |
| 5,453,948 | 9/1995 | Yoneda | 365/203 |
| 5,473,576 | 12/1995 | Matsui | 365/203 |
| 5,499,210 | 3/1996 | Usami | 365/227 |
| 5,521,875 | 5/1996 | Callahan | 365/203 |
| 5,574,698 | 11/1996 | Raad | 365/203 |
| 5,619,464 | 4/1997 | Tran | 365/203 |

*Primary Examiner*—David C. Nelms
*Assistant Examiner*—Trong Phan
*Attorney, Agent, or Firm*—Michael T. Gabrik

[57] ABSTRACT

A low power RAM device including a bit line precharge circuit which selectively precharges only those bit lines which will be read in an effort to minimize precharge and overall RAM power consumption. The preferred RAM precharge circuit uses a precharge device in the sense amplifier as the primary bit line precharge device to selectively connect and precharge the selected bit line through a column MUX. The preferred RAM precharge also includes secondary bit line precharge devices for each bit line to enable trickle charging thereof to prevent hazardous RAM data corruption. Since RAM corruption occurs only after several clock cycles, the secondary precharge devices comprise small transistors having only ¹/₂₀ the size of normal precharge device to conserve precharge power requirements. The RAM device includes a carefully controlled timing sequence of precharge signal, column-select signals, and word-line signals, to selective precharge the selected bit line and to remove the hazardous power consuming DC current path to further reduce power consumption therein.

14 Claims, 9 Drawing Sheets

FIG._3A
(PRIOR ART)
CLOCK

FIG._3B
(PRIOR ART)
ADD INPUT 172

FIG._3C
(PRIOR ART)
ADDRESS DECODE
160, 180

FIG._3D
(PRIOR ART)
PCH 111

FIG._3E
(PRIOR ART)
WL 161 & YS 171

FIG._3F
(PRIOR ART)
DOUT 151

FIG._10A CLOCK

FIG._10B ADD INPUT 672

FIG._10C ADDRESS DECODE 660, 680

FIG._10D PCH 611

FIG._10E RYS 671

FIG._10F RWL 661

FIG._10G DOUT 651

5,828,610

LOW POWER MEMORY INCLUDING SELECTIVE PRECHARGE CIRCUIT

BACKGROUND OF THE INVENTION

1. Field of the Invention

This invention relates generally to Random Access Memory (RAM) devices, and is particularly concerned with improved bit line precharge circuitry to reduce power dissipation during memory read operations.

2. Description of the Related Art

Figure 1:
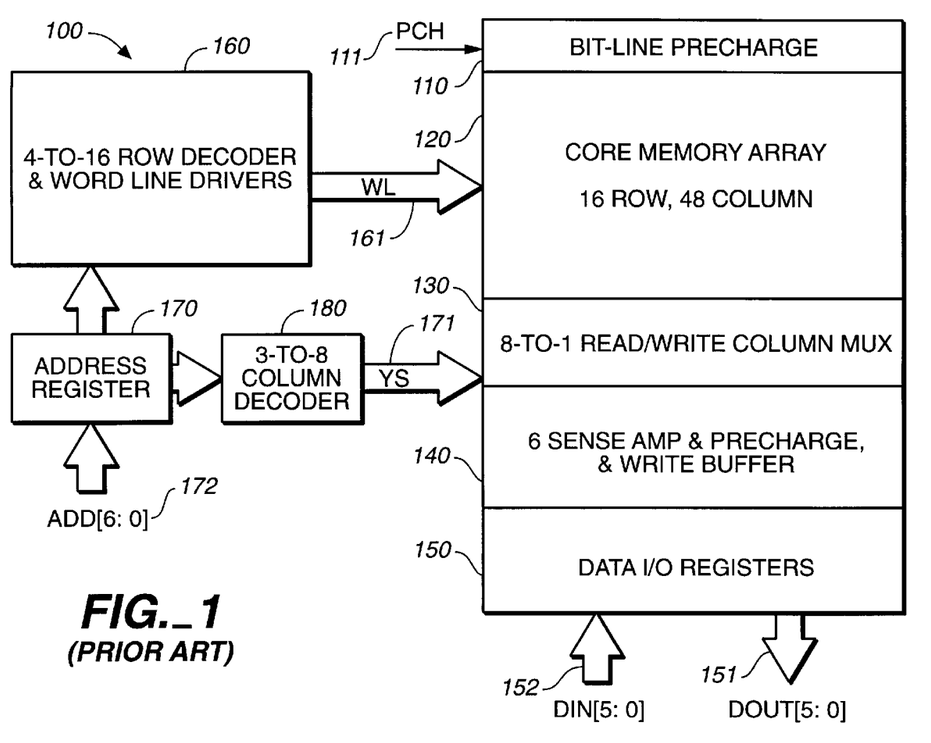
FIG. 1 is a block diagram of a conventional RAM.

FIG. 1 illustrates a traditional RAM 100. To ease description thereof, the RAM 100 has a 7 bit address input and a 6 bit wide data word (i.e. 6 bits per each addressed location). The total number of bit cells in the core memory array 120 is therefore $6 \times 2^7 = 6 \times 128 = 768$, and is organized into 16 rows and 48 bit columns. Each row is segmented into 8 words of data.

The 48 columns are partitioned into 6 groups indicative of the 6 bit positions in each data word. Every group of 8 column cells will share one 8-to-1 read write column mux (multiplexed switching device) 130, combination read sense amplifier ("sense amp") & write buffer 140, and data I/O registers 150. Also, all the individual RAM cells in each row share the same word line WL 161. All the cells in each column share the same bit line or bit line pairs which pass the data into or from each RAM cell.

In a typical read operation, RAM receives a 7 bit source address from input terminal ADD[6:0] 172 and latches it in the address register 170. The upper 4 bits of this source address enter the row decoder 160 to select 1 out of the 16 rows and to activate appropriate WL 161 for the selected row. The 48 bit cells on the selected row are accessed at the same time by the word-line 161, and they begin to assert memory data signals onto the 48 column bit lines. Meanwhile, the lower 3 bits of the source address concurrently enter the column decoder 180 to select 1 out of the 8 columns corresponding to the data word to be accessed by activating the appropriate column Select YS 171.

Once the appropriate column select YS 171 is asserted, the 6 bits of data corresponding to the selected data word to be read is sifted from the 48 bit lines within the selected row through 6 8-to-1 Column MUXs 130. These 6 data signals enter the 6 associated sense amplifiers 140 to generate the final large data signals, which then drive data I/O 150 to generate DOUT[5:0] 151.

Precharge devices 140 are included in RAM 100 in order to enhance the ability of sense amplifiers to detect the information contained in the selected cells as well as speeding up the detection process itself.

A write operation for the RAM 100 is similar to address decode and memory cell access used in the aforementioned read operation, except that the write data DIN[5:0] 152 drives the write buffers (part of block 140), which in turn drive through the 1-to-8 MUX 130 and onto selected column bit lines, and are finally written into the specified memory cells inside the memory array 120.

Figure 2A:
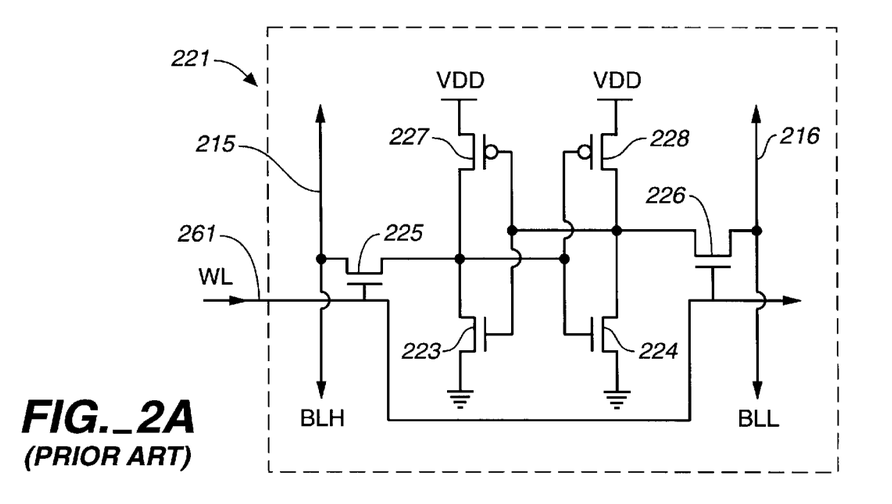
FIG. 2A is a circuit diagram of a typical MOS SRAM memory cell contained within the RAM of FIG. 1.

FIG. 2A illustrates a typical MOS static RAM cell 221 which the memory core array 120 may contain. Here, PMOS transistor 227 & NMOS transistor 223 coupled in series to form the first inverter of the memory cell, and PMOS 228 & NMOS 224 are coupled in series to form the remaining inverter. These two inverters are connected in a positive feedback fashion to create a latch memory device. NMOS 225 & NMOS 226 transistors serve as transmission gates or pass transistors connecting the latch memory cell to bit line pair BLH 215 & BLL 216. The gates of NMOS transistors 225 and 226 are connected to word-line WL 261.

In a different SRAM design, the PMOS 227 & 228 pull-up transistors are substituted by resistors. However, these type of RAM cells have relatively weaker ability to drive a "1" (high logic level) onto the bit line or bit line pairs than their ability to drive a "0" (low logic level) during a read operation. Therefore, to compensate for this weak "1" problem, SRAM have responded by providing a bit line precharge circuit such as that illustrated in FIG. 2B. The precharge circuit of FIG. 2B operates based on precharge signal PCH 211 and is shown having NMOS pull-up transistors 213 and 214 connected to VDD for driving the bit lines BLL 216 and BLH 215 to a pre-determined "1" to solve the weaker "1" ability problem of the RAM cell and to speed up the RAM read operation. In so doing, the read latencies of the RAM cell are determined mostly by its ability to drive a "0" onto the bit line, in conjunction with the speed of the precharge transistors 213, 214 to precharge the bit lines to a "1".

Figure 2B:
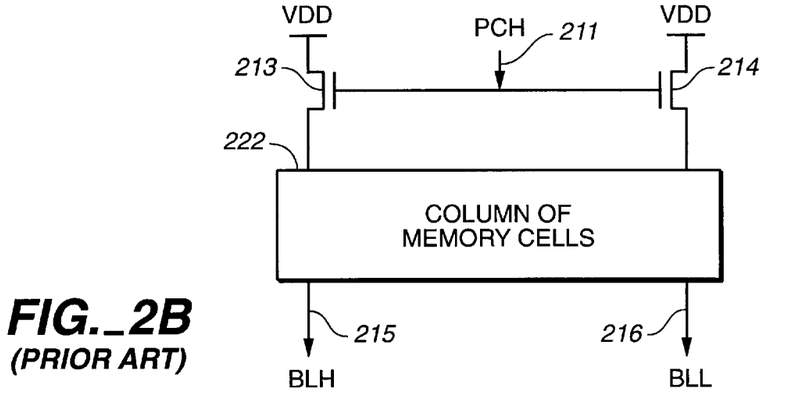
FIG. 2B is a circuit diagram of conventional MOS RAM bit line precharge circuitry used in connection with the RAM of FIG. 1.

Since conventional SRAM designs employ a bit line precharge circuit like that shown in FIG. 2B, the read sense amplifier 140 shown in FIG. 1 will be designed to distinguish a "0" on the bit line by detecting a very small voltage drop from the precharged "1" level (VREF). This allows the NMOS pull-down devices 223 & 224 as well as PMOS pull-up device 227, 228 within each RAM cell 221 (FIG. 2A) to be at the minimum size allowed by the fabrication process, and helps to minimize overall RAM cell size. But, this cell design requires that precharge devices 213 & 214 (FIG. 2B) be relatively large to permit enough current flow from VDD to always drives the bit line 215, 216 to a high level with a desirably short precharge latency. Moreover, it will be recognized that the bit lines 215 & 216 extend throughout the entire core memory array 222 and thus exhibit a relatively large capacitive loading. This characteristic again requires that precharge devices 213 & 214 to be large in order to drive the bit lines with an acceptably short lag time.

Figure 3A:
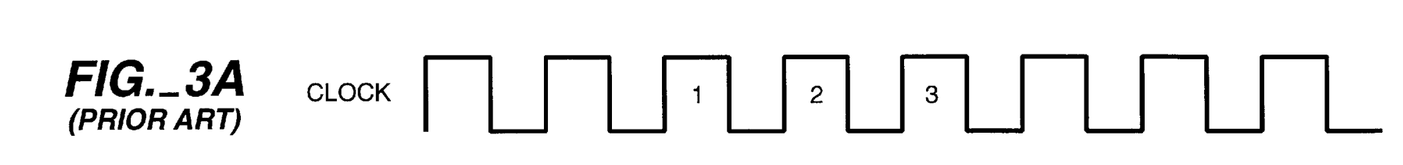
FIGS. 3A–3F collectively depict a timing diagram of a read operation involving the RAM of FIG. 1.
Figure 3B:
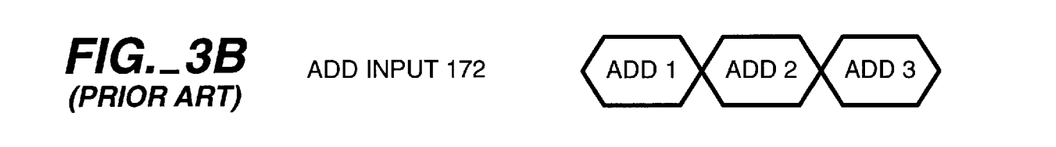
Figure 3C:
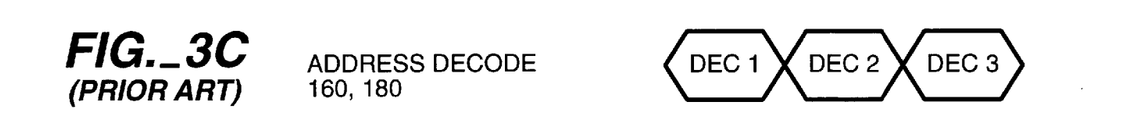
Figure 3D:
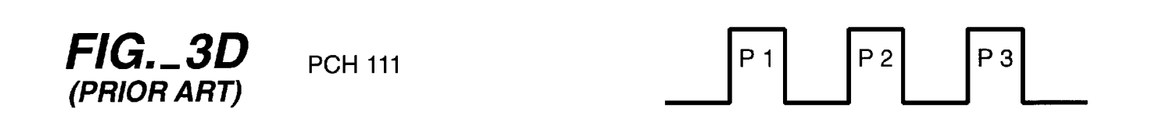
Figure 3E:
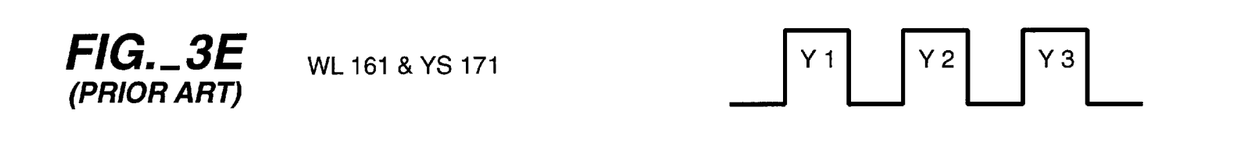
Figure 3F:
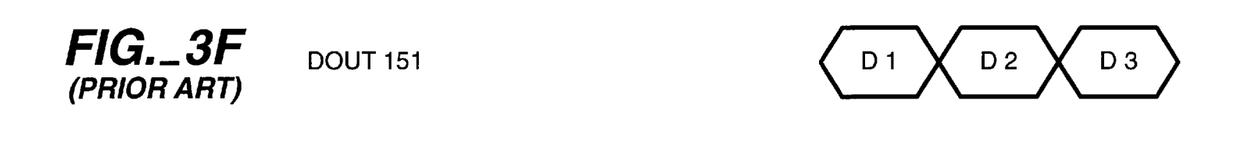

FIGS. 3A–3F collectively illustrate the typical read operation timing sequence of traditional RAM 100. Immediately prior to the rising edge of clock cycle 1 in clock waveform shown in FIG. 3A, the desired source address (ADD input 172) is latched as add1 (FIG. 3B). During the first half of the same clock cycle, the address is decoded in decoders 160 and 180 as dec1, as shown in FIG. 3C. During the second half of the clock cycle, PCH 111 (FIG. 3D) is asserted and the bit lines 215 & 216 are charged by precharge NMOS transistors 213 & 214 forming the precharge circuit 110. During the first half of the succeeding clock cycle (clock cycle 2), the decoder 160 & 180 activate the selected row WL 161 & the selected column YS 171 respectively as in FIG. 3E. This forces the selected row of RAM cells 221 within the core memory array to assert their stored bits on respective bit lines 215, 216 as well as group column MUX 130 to sift out the appropriate columns for the desired data word being accessed. During the second half of clock cycle 2, the read sense amplifiers 140 amplify the read RAM data generated by the group column MUX 130 and deliver the amplified data to output terminal DOUT 151 as d1, as shown in FIG. 3F.

Figure 4:
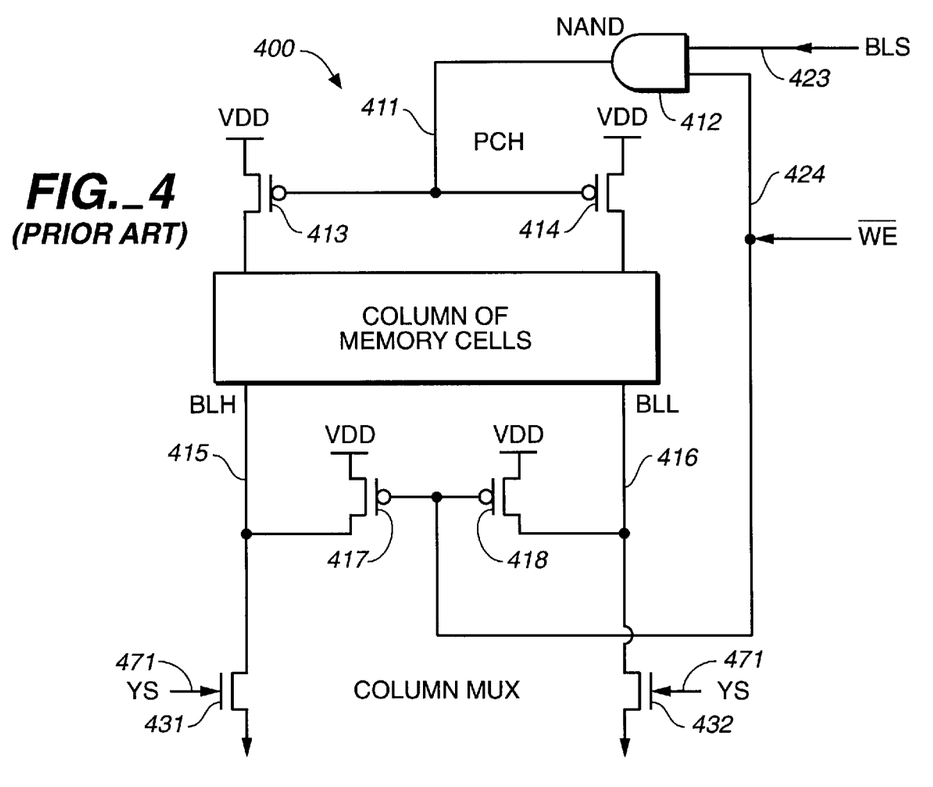
FIG. 4 is a circuit diagram illustrating a known alternative bit line precharge circuit.

It should be appreciated here that, as faster and faster memories are required to interface with ever-faster processing circuitry, RAM designers have focused efforts on reducing the precharge latencies exhibited in the precharge circuit 110 discussed hereinabove. FIG. 4 illustrates a known alternative precharge circuit design 400 useful in improving precharge speed, as disclosed in U.S. Pat. No. 5,349,560 to Suh et al. As shown in FIG. 4, an extra pair of precharge pull up transistors PMOS 417 & 418 are coupled to bit line pair BLL and BLH and are located adjacent the aforementioned group column MUX on the physical layout of the RAM device incorporating precharge circuit 400. When combined with conventional precharge devices 413 & 414, transistors 417 and 418 can be activated to substantially increase the current path to VDD while reducing capacitive effects of the long bit line pairs through their physical proximity to the group column MUX. Here, precharge devices 413, 414, 417, 418 are controlled by NAND 412 analyzing two signals BLS 423 (Block Select) and $\overline{WE}$ 424 (Not Write Enable). The output of NAND 412 is asserted on the gates of precharge devices 413 & 414 via line 411. In this arrangement, these precharge devices are activated when the memory block is selected for a read operation(BLS=1 & $\overline{WE}$=1). During a write operation ($\overline{WE}$=0), there is, no precharge. Bit line signals BLL and BLH are transferred through transfer transistors 431 & 432 by column decoding signal YS 471 when the memory cells are selected.

Figure 5:
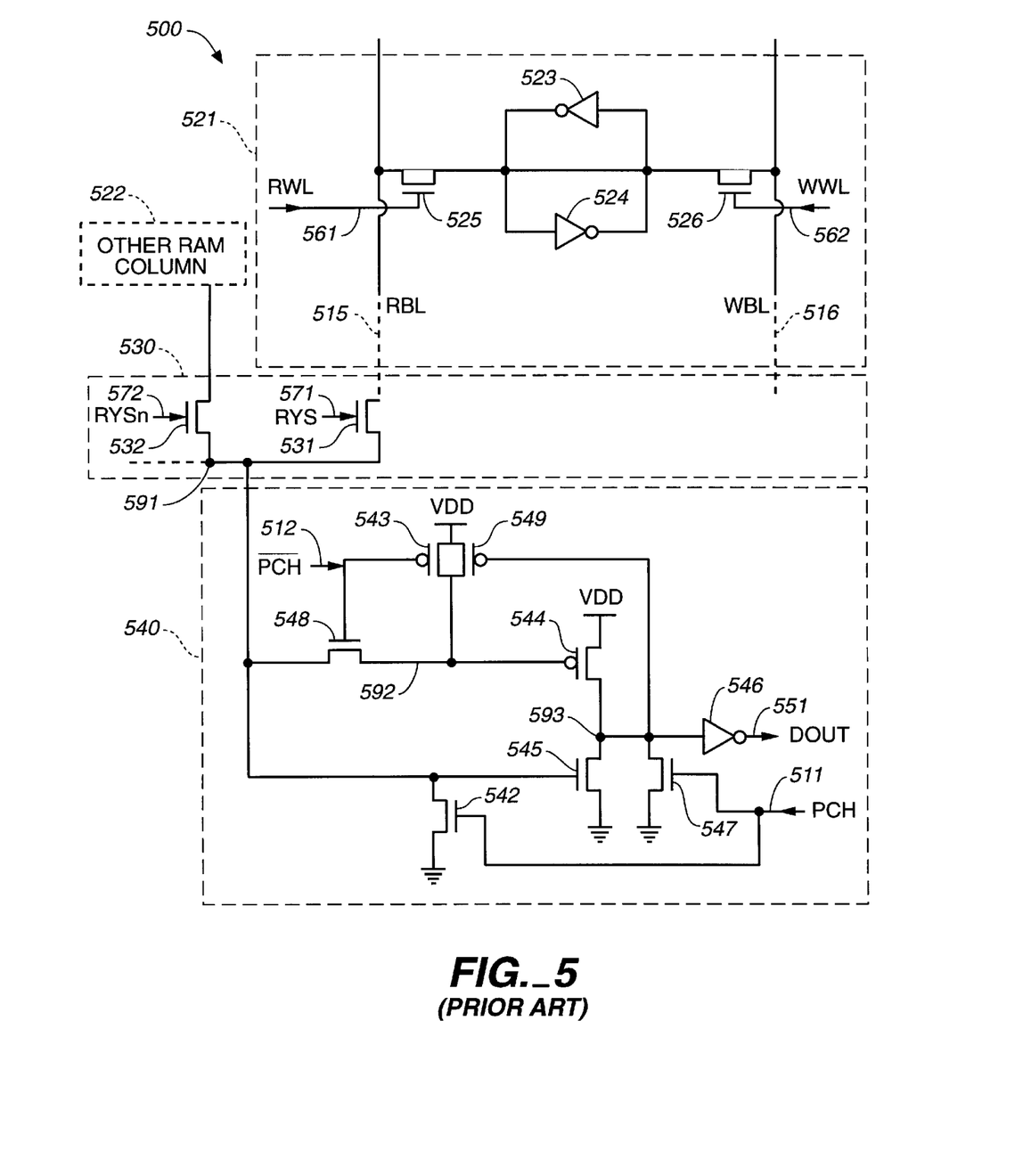
FIG. 5 is a circuit diagram illustrating yet another known alternative bit line precharge circuit.

FIG. 5 illustrates another conventional bit line precharge circuit design 500 useful in reducing precharge latencies, as disclosed U.S. Pat. No. 5,521,875 to Callahan. This precharge circuit uses a two-port RAM cell 521, which consists of a read port NMOS transistor 525 gated by Read-Word-Line RWL 561 and a write port NMOS transistor 526 gated by Write-Word-Line WWL 562. Transistors 525 and 526 are connected by a pair of cross-connected inverters 523 and 524. The opposite ends of transistors 525 and 526 are connected to Read-Bit Line RBL 515 and Write-Bit Line WBL 516, respectively. The read MUX contains pass transistors 531, 532, etc. forming an operational part of the column MUX 530. The read MUX is gated by Read-Column-Select RYS 571, RYSn 572, etc. to select one RBL 515 data from the many RAM columns (521, 522, etc.) present in the core memory array (not shown) for passage onto node 591. During a read operation, data is read from the selected RAM cell, e.g., RAM cell 521, to RBL 515, to the selected read MUX NMOS transistor 531, to Sense Amp 540, and finally through inverter 546 to DOUT 551.

During bit line precharge, input node 592 of sense amp 540 is precharged to a logic high level by PMOS transistors 543 & 549 and gated by precharge signal PCH 511 & $\overline{PCH}$ 512. Also input node 591 & output node 593 are precharged to a logic low level by NMOS transistors 542 & 547. Precharge speed-up of this design is realized by charging the selected bit line RBL 515 to low level by sense amp precharge NMOS transistor 542, through read MUX NMOS transistor 531, during the precharge period, so as to shorten the time needed for the RAM cell 521 for driving a "0" on to the RBL 515 during the subsequent read period.

When precharge ends and the evaluation mode begins, signal PCH 511 goes to a low state and signal $\overline{PCH}$ 512 goes to a high state. The shunt NMOS transistor 542 turns off to remove the ground connection to the input node 591. NMOS transistor 548 turns on and PMOS transistor 549 remains on. If the memory cell is outputting a "1", input node 591 charges up to the point where PMOS transistor 544 is turned off, NMOS transistor 545 is turned on, and PMOS transistor 549 remains on, but because of the speed at which this occurs, the output terminal 551 stays at the precharged "0" level.

Figure 9A:
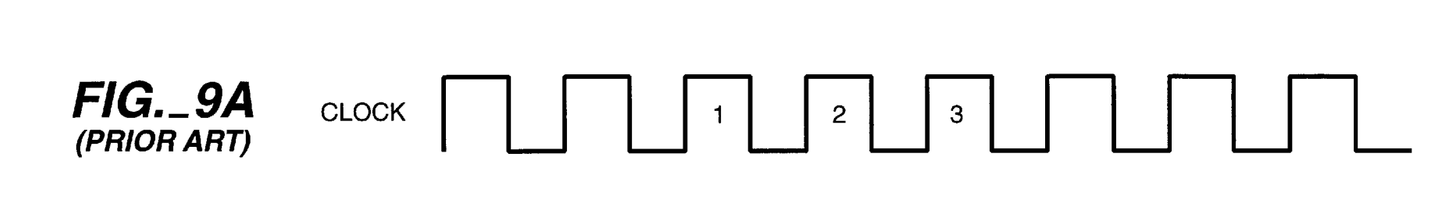
FIGS. 9A–9D collectively depict read operation precharge circuit timing in relation to the precharge circuit of FIG. 5.
Figure 9B:
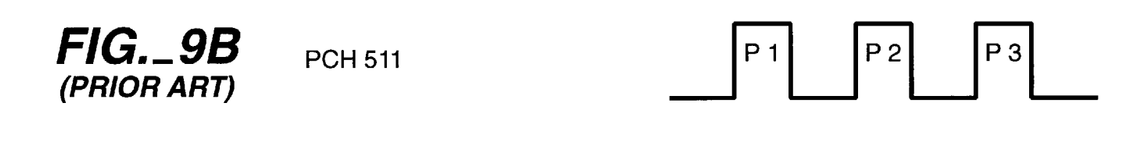
Figure 9C:
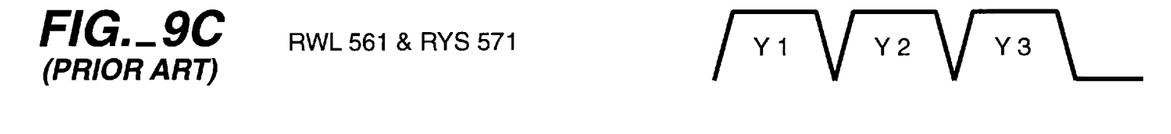
Figure 9D:
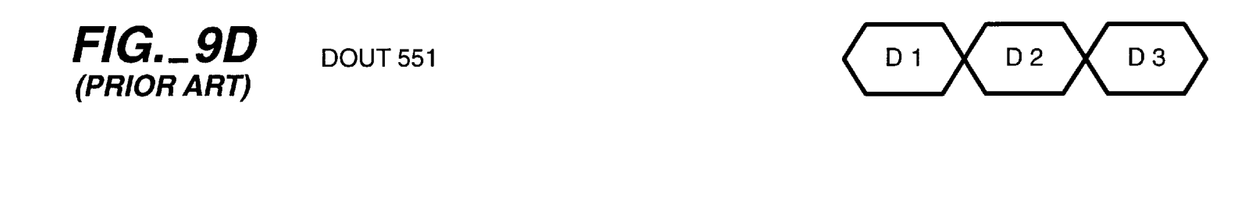

FIGS. 9A–9D collectively illustrate the precharge/read timing sequence of precharge circuit 500 shown in FIG. 5. In the more traditional precharge circuit 110 described hereinabove, the MUX gate or transistor 531 is off during the precharge period (See FIG. 3). But in the precharge circuit 500 shown in FIG. 5, both the Read-Word-Line RWL 561 and Column Select RYS 571 are asserted at a high logic level during the precharge period, such that the sense amp precharge NMOS transistor 542 can precharge back to node RBL 515 through MUX NMOS transistor 531 (FIG. 9C).

However, none of these conventional precharge circuit designs address the issue of static RAM power consumption, which has become an especially important design consideration in view of widespread influx of intelligent mobile and "green" products into the market place. Even with the advent of advanced power management techniques and exotic power storage media, the ever increasing numbers of RAM cells required to support desired product functionality makes their power consumption a critical issue.

For example, in RAM 100 shown in FIG. 1, that every RAM column needs a dedicated pair of precharge devices in which to independently drive its associated bit line pairs. In RAM cell 100 shown in FIG. 1, 48 transistor pairs would be required. Therefore, the device that drives the Precharge signal, PCH 211, must be extremely large to handle the current required to drive all the column pairs. This driving device, typically an NMOS transistor, is so large in fact that it and rest of the precharge circuit 110 become the major power consuming circuitry of the RAM device 100.

Furthermore, most of the power required to precharge the bit columns in the traditional precharge circuit 110 is wasted. As discussed hereinabove, only data from the 6 columns out of the total 48 columns, selected by column select signal YS 171 are finally muxed to the sense amplifier to be read out as the data word. But all 48 pairs of bit lines in the core memory array 120 are precharged for every read operation, even though the data on the remaining (42=48−6) pairs of bit lines are discarded. Thus, in RAM 100, 42/48=87.5% of the precharge power requirements are wasted in servicing the read operation.

For the known precharge circuit 400 shown in FIG. 4, even though the bit line precharge devices are not active when the memory is in write operation ($\overline{WE}$=0) or when the memory block is not selected (BLS=0), they are all concurrently energized during a read operation. Thus, like in RAM 100, every bit line is precharged, even when their associated cell columns do not contain data relevant to the selected data word.

Precharge circuit 500 illustrated in FIG. 5 might theoretically reduce precharge power dissipation within a RAM device by precharging only the bit line selected by the read MUX NMOS transistor 530. But it will be appreciated here that the actual power dissipation really increases, compared to other precharge circuit alternatives highlighted hereinabove, due to an undesirable DC current path which may be formed during precharge. In precharge circuit 500, both RWL 561 and Column Select RYS 571 are high during the precharge period when, by definition, PCH 511 is high, as illustrated in FIGS. 9A–9D. Therefore, when precharge NMOS transistor 542 is on, NMOS transistors 531 and 525 are also on to form a DC current path from sense amp precharge NMOS transistor 542 to the internal inverter 523 of RAM Cell 521.

In operation, there is a 50% chance that any RAM cell 521 stores a "1". In such case, during the precharge period, the RAM cell inverter 523 is driving a high to RBL 515 while the Sense Amp Precharge NMOS transistor 542 is driving RBL 515 to low through the read MUX transistor 531. So, during this precharge period, A low impedance DC current path exists from VDD, to pull-up PMOS transistor (not shown) of RAM cell inverter 523, to RAM cell NMOS transistor 525, to read MUX NMOS transistor 531, to sense amp NMOS transistor 542, and onto ground, which, in turn, dissipates an appreciable amount of power. As disclosed in the Callahan '875 patent, the DC current ranges as high as 466 microamperes per each selected bit line for this design.

OBJECT OF THE INVENTION

Therefore, it is an object of the present invention to realize a RAM device incorporating precharge circuitry having reduced power consumption requirements over known designs while retaining acceptable precharge performance.

SUMMARY OF THE INVENTION

In accordance with this and related objects, the present invention features pre-decoding at least a portion of the data word to be read and precharging only those bit lines whose corresponding RAM cells form the desired data word. In particular, the preferred embodiment of the invention utilizes an asynchronous column decoder interposing the RAM cells into which the columnar address of the desired data word is fed. This column decoder receives the necessary address information at the beginning of every clock cycle, so that corresponding RAM cell columns can be quickly ascertained and their associated bit lines will be ready for evaluation during the second half of the same clock cycle. This selective precharge significantly reduces precharge power requirements.

Further, the preferred embodiment of the invention includes a switchable pull-up device interposing the column decoder and the data output port of the RAM device for precharging only the selected bit lines to a logic high. Preferably, a pull-up precharge device is specified for every bit position of the data word, and each is large enough so that its associated bit line can quickly precharge from low to high logic levels through the column decoder within half a clock cycle. Use of a switchable pull-up device prevents a DC path to ground forming within the RAM cell.

To prevent RAM corruption due to infrequent precharging, the preferred embodiment also includes a dedicated pull-up device for every bit line in the RAM. However, because an isolated precharged bit line discharges rather slowly, these pull-up devices are preferably sized at least 10 times smaller than that of the selected bit line pull up precharge device, as well as being 10 to 20 times smaller conventional precharge devices. Since these pull-up devices are relatively small, they need only gradually pull up isolated bit lines between intermittent primary precharge, and they consume much less power-sapping current than is needed by corresponding devices in conventional precharge circuit designs. Therefore, even with the inclusion of these dedicated precharge devices, precharge power consumption is still significantly less compared to known alternative.

Further, the preferred embodiment of the invention includes a single-ended sense amplifier circuit interposing the output nodes of the column decoder and the output port of the RAM device in parallel with the aforementioned switchable pull-up device. The sense amplifier condition and amplifies the bit information asserted on the selected bit lines and form the resultant data word. Again, preferably, a sense amplifier circuit is specified for each bit line position of the data word.

Moreover, this sense amplifier circuit preferably includes an inverting buffer coupled in parallel with a switchable pull-down device to the input port of a second inverter. Feedback from the input port of the second inverter is used to control activation of this pull-down device. This configuration further increases the sense amplifier circuit's ability to see a logic low asserted on the associated bit line as well as quickening its sense response thereof, since the first inverting buffer asserts a logic high causing the pull-down device to activate and pull down the output of the column decoder quickly to a logic low. In addition, using an NMOS transistor as the pull-down device contributes to conservation within the RAM by pulling the buffer input to full rail ground, thereby eliminating a DC current path through the first inverting buffer.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENT

Reference will now be made in detail to the preferred embodiment of the invention, examples of which are illustrated in the accompanying drawings.

Figure 6:
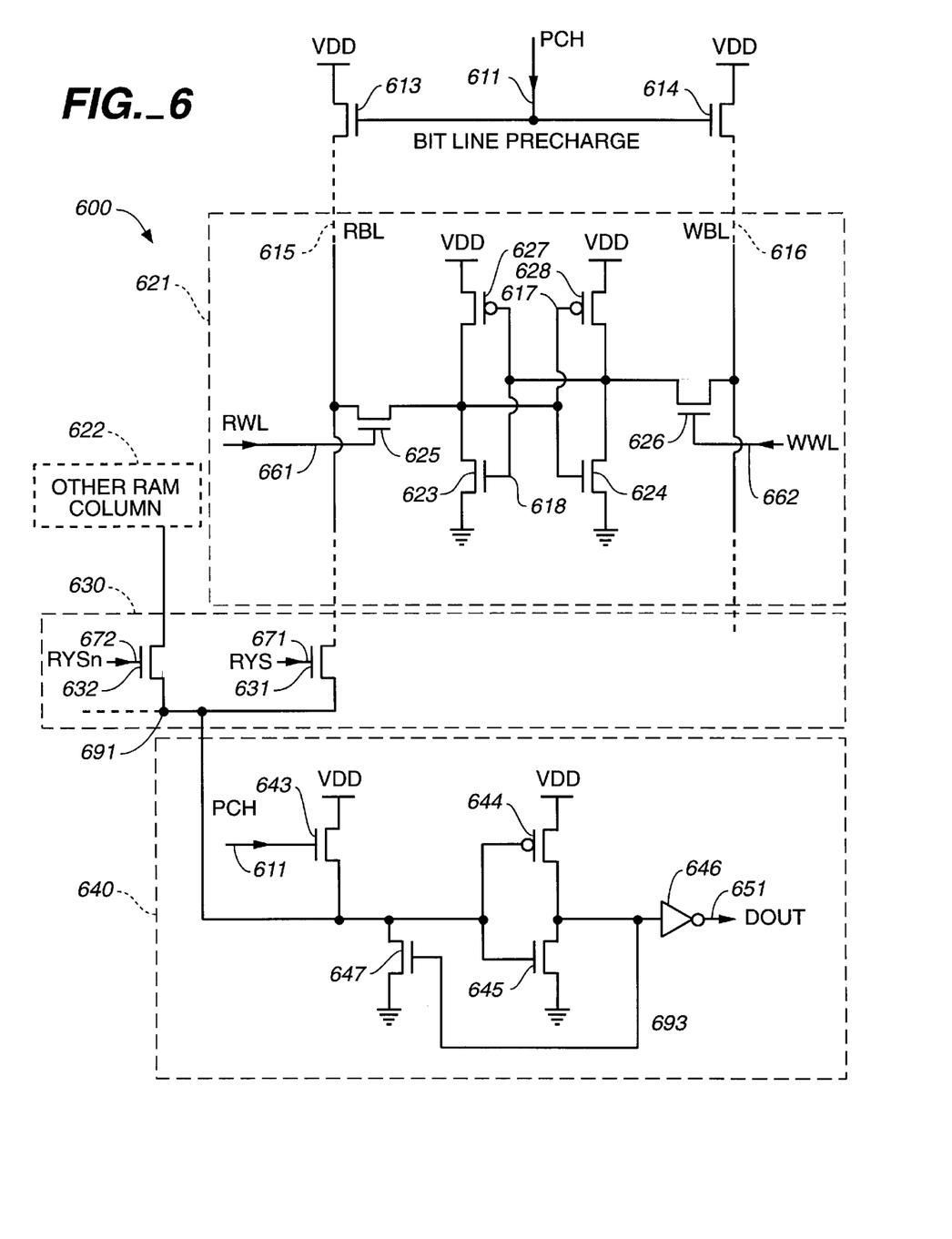
FIG. 6 is a circuit diagram illustrating the bit line precharge circuit according to the preferred embodiment of the invention.

FIG. 6 is a circuit diagram illustrating the precharge circuit 600 according to the preferred embodiment of the invention. Precharge circuit 600 shown herein includes a pair of bit line precharge devices 613 and 614 connected to the RBL 615 and WBL 616 serving as the read and write bit lines respectively for a column of RAM cells including RAM cell 621, column MUX (multiplexed switching device) 630 switchably connected to RBL 615, and sense amplifier circuit 640 including bit line primary precharge NMOS transistor 643 connected to the output node 691 of the column MUX 630.

As mentioned hereinabove, each RAM column (e.g. RAM column 622 in FIG. 6) includes a number of individual RAM cells 621 which all connect to the same pair of read and write bit lines such as RBL 615 and WBL 616. For each RAM column, there are 2 NMOS secondary precharge devices 613 & 614 controlled or switched by precharge control signal PCH 611. NMOS 613 has its drain connected to RBL 615, its source connected to VDD power supply, and its gate connected to PCH 611. NMOS 614 has its drain connected to WBL 616, its respective source connected to VDD power supply, and its respective gate connected to PCH 611. The RBL 615 passes the read data output from RAM Cell 621 to sense amp 640 through passes transistor 631 within column MUX 630. The WBL 616 pass the write data input from a write buffer 140 (See FIG. 1) into the RAM cell 621 when routed through column MUX 630. As will be appreciated by those ordinarily skilled in the art, several RAM columns 622 may interface with the same column MUX 630 and sense amp 640.

Still referring to FIG. 6, dual port static RAM cell 621 is a six transistor positive feedback latch structure. PMOS 627 & NMOS 623 forms the first inverter, with the drain of PMOS 627 connected to the drain of NMOS 623 as the inverter output terminal 617, with the gate of 627 connected to the gate of 623 as the inverter input terminal 618. The source of PMOS 627 connected to VDD power supply and the source of NMOS 623 connected to ground rail. PMOS 228 & NMOS 224 forms the second inverter in a similar fashion as the first inverter, and has input node 617 coupled to the output node 695 of the first inverter and output node 694 coupled to the input node 618 of the first inverter in a well-known positive feedback arrangement. Thus, RAM cell 621 becomes a latch memory device with nodes 617 and 618 being the storage nodes to store the RAM cell data.

NMOS pass transistor 625 serves as the read port of the RAM cell 621. NMOS 625 has its source connected to storage node 617, its drain connected to RBL 615 and its gate connected to control signal Read-Word-Line RWL 661. During a read operation involving RAM cell 621, the row decoder 660 (See FIG. 7) decodes the input memory address to select and energize the appropriate RWL 661 and to turn on the NMOS pass Transistor 625, which then passes the stored data from the memory storage node 617 onto the RBL 615. When reading a "0", the NMOS pull-down transistor 623 discharges the Read-Bit Line RBL 615. When reading a "1", the PMOS pull-up transistor 627 maintains the precharge voltage on the RBL 615.

Similarly, NMOS pass transistor 626 serves as the write port of the RAM cell 621. NMOS 626 has its source connected to storage node 618, its drain connected to WBL 616 and its gate connected to Write-Word-Line WWL 662. In a write operation involving RAM cell 621, the row decoder 660 decodes the input memory address to select and energize the appropriate WWL 662 and to turn on the corresponding NMOS pass Transistor 626, which then passes the write input data from WBL 616 into the Memory storage node 618.

As shown in FIG. 6, the column MUX 630 contains NMOS pass transistors 631, 632, etc. and are controlled by control signal Read-Column-Select RYS 671, RYSn 672, etc. In a read operation, the column decoder 680 (FIG. 7) decodes the input memory address to select a RYS 671 and to turn on the corresponding column MUX NMOS transistor 631. The NMOS transistor 631 serves as a bi-directional transmission gate to work both in the precharge and data read phases of the read operation. During the precharge phase, the selected NMOS transistor 631 is switched on to allow the sense amp precharge NMOS transistor 643 to pull up or charge from node 691 "backward" through the selected NMOS transistor 631 and onto the selected bit line RBL 615. During the succeeding data read phase, the data stored on node 617 of RAM cell 621 passes on to RBL 615 of the selected RAM column, "forward" through the selected NMOS transistor 631, and finally to the input node 691 of sense amplifier circuit 640.

Also as shown in FIG. 6, sense amplifier circuit 640 is a single ended sense amplifier which does not have any DC current path (as is the case with a differential sense amp), and is therefore more power saving. The PMOS 644 transistor & NMOS 645 transistor forms the first inverter, with the gate of NMOS 645 connected to the gate of PMOS 644 as the input node 691 of the sense amplifier circuit 691, and with the drain of PMOS 644 connected to the drain of NMOS 645 as the first inverter output node 693. The first inverter output node 693 is in turn the input node of the second inverter 646, which supplies enough driving current onto the output node DOUT 651. These 2 inverters forms the basic operational unit of the sense amplifier circuit 640. The primary precharge NMOS transistor 643 has its source connected to VDD, its drain connected to sense amp input node 691, and its gate connected to the precharge control signal PCH 611. The feedback NMOS transistor 647 has its gate connected to the output of the 1st inverter comprising complementary transistors 644 and 645, its drain connected to the sense amp input node 691, and its source connected to ground.

During a read operation, The sense amp input node 691 is first precharged to a logic "1" (high) level (VDD−Vtn) which forces output terminal DOUT 651 to 1 during precharge. Then during the subsequent data read, if the data input from the RAM Cell 621 is a "1", no state changes occur and DOUT 651 stays "1". If, however, the data bit received from the selected RAM Cell 621 is a "0" or a logic low level, the sense amp input node 691 will start to fall to "0" slowly. The first inverter will detect a "0" level on the input node 691 and start to drive output node 693 toward "1" level and also pull node DOUT 651 toward "0" via the second inverter 646. In this process, the rise of node 693 to logic level 1 will turn on the feedback NMOS 647 and start to form a positive feedback loop to speed up the falling of node 691, and quickly force sense amp output terminal DOUT 651 to 0 to complete the read operation.

FIG. 6 illustrates that the sense amp precharge NMOS transistor 643 not only precharges the sense amp input node 691, but also precharges "backward" to the selected Read-Bit Line RBL 615 through the selected column MUX NMOS transistor 631. Therefore, the sense amp precharge NMOS transistor 643 also serves as the primary precharge transistor for the selected bit line. This selective recharge process only charges the selected RBL 615 of the selected RAM column and therefore greatly conserves the precharge power which would have otherwise been wasted to precharge all the RBL 615 & WBL 616 bit lines of the other unselected RAM columns 622 in the conventional designs.

As discussed hereinabove, in traditional RAM designs, every bit line pair RBL 615 and WBL 616 present in the RAM is quickly precharged to a threshold drop below the supply voltage (VDD−$V_{tn}$) or to VDD by the bit line Precharge NMOS transistors 113 and 114. This precharge usually occurs during the first half of every cycle so that the bit lines are ready for evaluation during the second half. By first pre-decoding the column portion of the address using column decoder 680 (FIG. 7), the precharge circuit according to the preferred embodiment of the invention uses the primary precharge NMOS transistor 643 to only precharge the Read-Bit Line RBL 615 which will be read for forming a bit of the accessed data word. The power consumption is therefore reduced greatly when only those read bit lines selected by the column decoder are precharged.

To illustrate the precharge power saving envisioned by this embodiment, take the case of a RAM according to the present invention where 8 RAM columns 622 share a common sense amplifier 640 and a primary Precharge NMOS transistor 643. In a traditional design (e.g. RAM 100 discussed hereinabove), both RBL 615 & WBL 616 of all 8 columns, therefore 2×8=16 bit lines in total, will be precharged. In this example, however, only one selected read-bit line out of total 16 bit lines will be precharged. Therefore, the RAM precharge power is reduced by $1-(1/16)=15/16=94\%$ from the traditional precharge approach.

In the read operation, the selected RBL 615 is precharged primarily through intermittent precharging by the primary precharge NMOS transistor 643 of the sense amplifier 640, through the selected column MUX NMOS transistor 631. If there is no dedicated secondary precharge NMOS transistor 613 just for this RBL 615, then a subtle and perhaps unrecognized worst case will occur when a particular bit line RBL 615 has not been addressed by Column MUX 630 for several cycles while all the selected RAM cells on this RBL 615 all contain a "0" to drive the RBL 615 toward the low voltage level. In this scenario, the isolated RBL 615 will eventually drop to very low voltage level due to lack of precharge action from the primary precharge NMOS transistor 643. When this RBL 615 is very low, and if subsequently another RAM cell, which contain a "1", is selected by its word-line RWL 661, then the low voltage level on the bit line RBL 615, which has very big capacitance, will charge-share with the high voltage level on the RAM cell storage node 617, which has very small capacitance, and result in a low voltage level to the storage node 617 to erroneously "flip" the RAM cell content from "1" to "0". This unwanted process will result in corrupted RAM data and cause a soft error within the RAM.

It should be recognized here that in this data corruption event, it is the pull-down NMOS transistor 623 of the selected RAM cell 621 that discharges the RBL 615 in every read period. Therefore, Applicants aim to offset this possible discharge by slightly charging up the RBL 615 in each Precharge phase to keep the node RBL 615 above the VDD/2 threshold to prevent undesirable data corruption from occurring. To reach this charging/discharging offset so as to prevent the RAM data corruption, the precharge circuit according to the presently preferred embodiment of the invention includes secondary precharge NMOS transistor 613 which only needs to be large enough to offset the undesired discharge from RAM Cell NMOS transistor 623. Therefore, the secondary precharge transistor 613 only needs to be 1/20 the size of a traditional RAM bit line precharge NMOS transistor size, and thus only consumes less than 1/20 the precharge power of a traditional RAM. Similarly, Precharge NMOS transistor 614 is as small as NMOS transistor 613.

Taking the same eight RAM columns 622 sharing a common sense amplifier 640 described hereinabove and adding data corruption protection through placement of small NMOS devices 613 and 614 on all 16 bit lines, the precharge power requirements are reduced by $1-(1/16+1/20)=89\%$ from the traditional precharge approach.

FIGS. 10A–10G collectively illustrate the control signal timing used to control the preferred precharge circuit of the invention in a manner that prevents formation of a power wasting DC power path such as that discussed hereinabove in connection with known precharge circuit 500. As shown herein, during the precharge period when PCH 611 is high (FIG. 10D), only the column select 671 is high to turn on column MUX NMOS transistor 631 in order for primary precharge NMOS transistor 643 to precharge the selected RBL 615. But during this precharge time, the read word-line 661 is low, to prevent the occurrence of a faulty power consuming DC path leading from primary precharge NMOS transistor 643 through NMOS transistor 631 and ending at the NMOS transistor 623 of RAM Cell 621.

Figure 7:
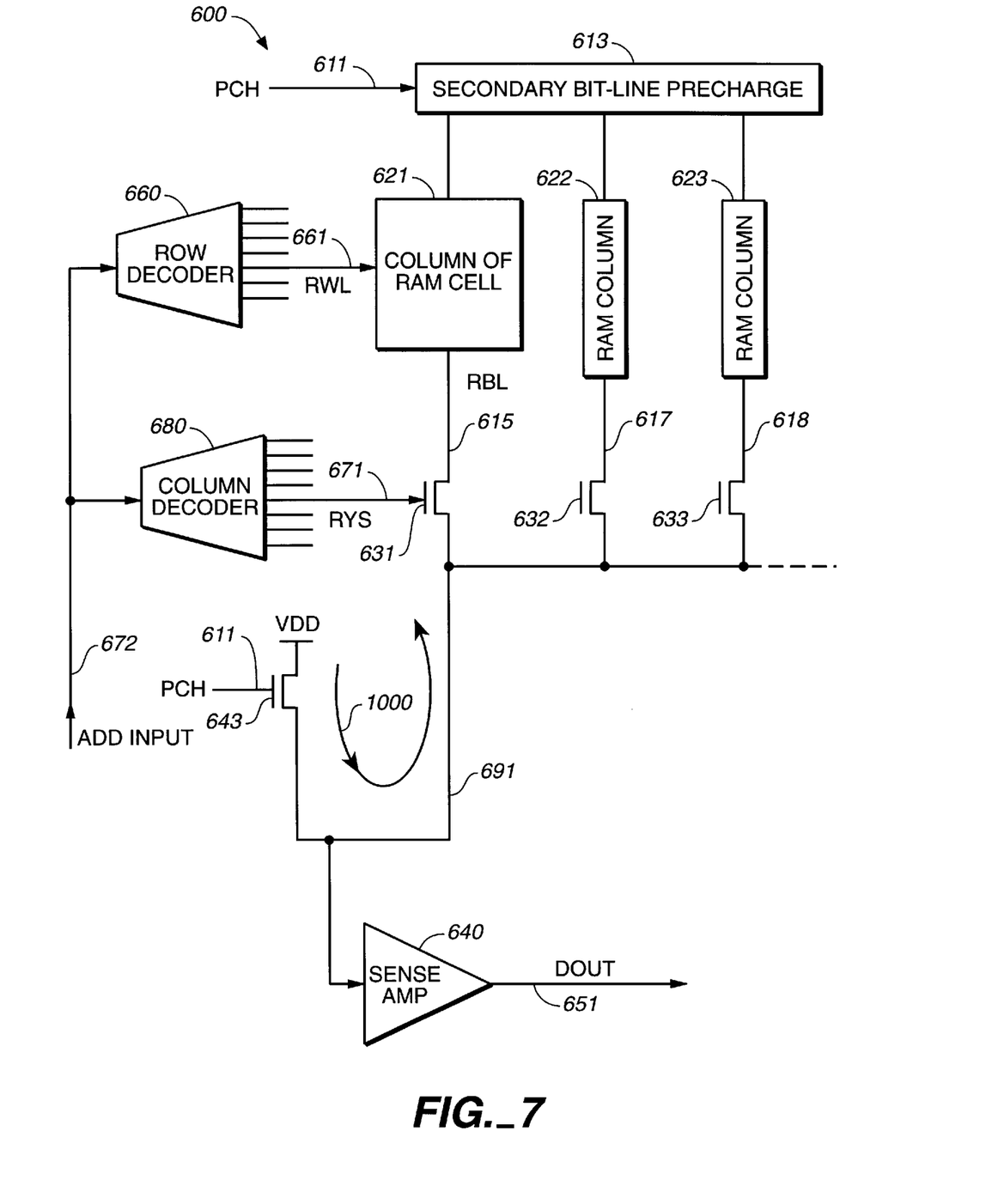
FIG. 7 is an overview circuit diagram illustrating the key circuit components of the precharge circuit of FIG. 6.
Figure 10A:
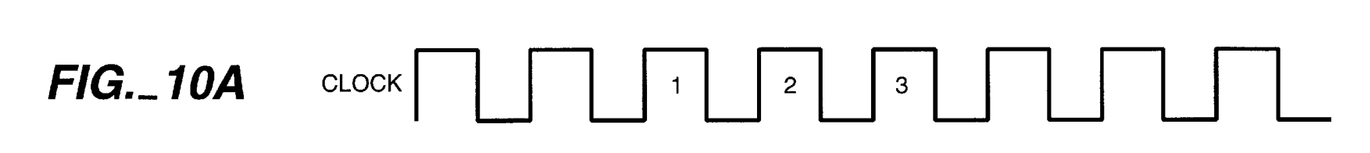
FIGS. 10A–10G collectively depict read operation precharge circuit timing according to the preferred embodiment of the invention.
Figure 10B:
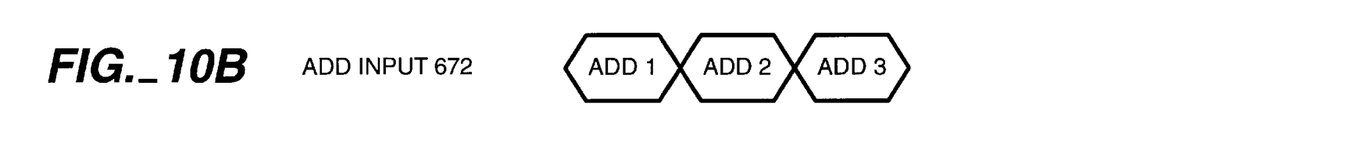
Figures 10C, 10D:
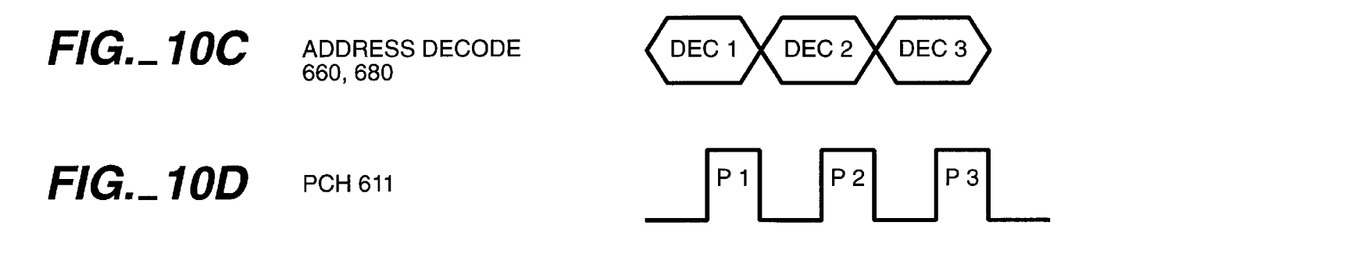

FIG. 7 is another illustration of the key circuit components of the precharge circuit according to the preferred embodiment. Referring to this figure, in conjunction with the timing chart of FIGS. 10A–10G, read operation details therefor will be described hereinbelow. Just prior to the rising edge of clock cycle 1 (FIG. 10A), the ADD input 672 is received as add1 (FIG. 10B). During the first half of this clock cycle, the address ADD input 672 is decoded in row decoder 660 and column decoder 680 as dec1 illustrated in FIG. 10C. The upper address bits of ADD input 672 enter the row decoder 660 to select a single RAM row and activate the Read-Word-Line signal RWL 661 of the selected row, as w1 in FIG. 10F. The lower address bits of ADD input 672 enter the Column Decoder 680 to select one RAM column 621 and to activate the Read-Column-Select signal RYS 671 of the selected column, as y1 in FIG. 10E. Also, during the second half (i.e. low phase) of clock cycle 1, PCH 611 will be asserted high (as p1 in FIG. 10D), to activate bit line precharge NMOS transistor 643.

Figure 10E:
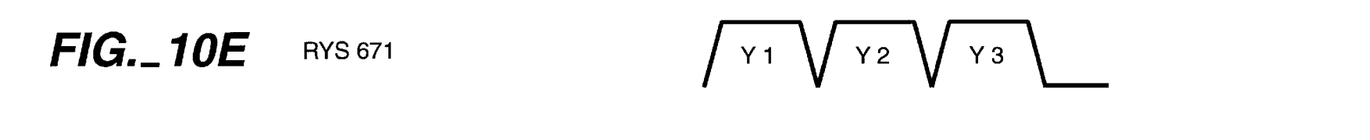

Referring to FIG. 10E, it should be noted here that the column select RYS 671 signal y1 will also be asserted to a logic high level during the second half of clock cycle 1. Doing so completes the connection between RWL 615 to primary precharge NMOS transistor 631 for precharging RWL 515 to the logic high level (the current direction is denoted by reference numeral 1000 in FIG. 7). Note too that the signal y1 remains asserted during the first half of succeeding clock cycle 2 in order to enable information stored in the RAM cell 621 to reach the input of the sense amplifier circuit 640 while RWL 661 signal w1 is high.

Figure 10F:
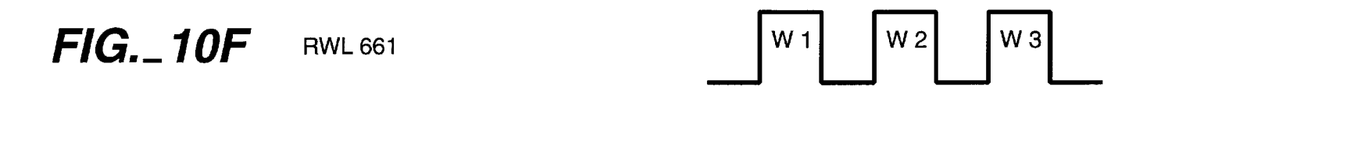

FIG. 10F shows that RWL 661 will only be asserted during the first half of each clock cycle to prevent a DC current path which could otherwise form between the primary precharge transistor 643 and the RAM cell 621. Keeping RWL low when PCH is high switches read pass transistor 625 off to isolate node 618 of the RAM cell and thus sever the potential DC current path.

Figure 10G:
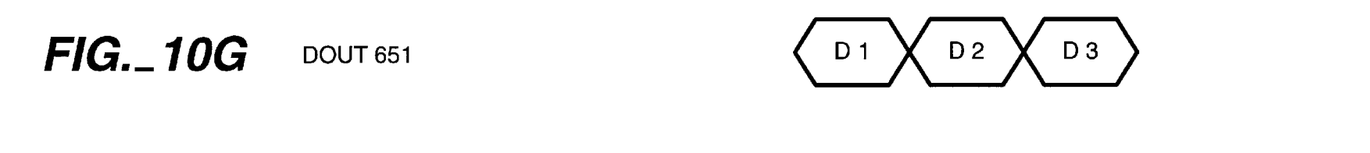

During the remaining half of clock cycle 2, the read sense amplifier circuit 640 amplifies the read RAM data and delivers it to RAM output terminal DOUT 651 as d1 shown in FIG. 10G to complete the read operation within approximately 2 full clock cycles.

Figure 8:
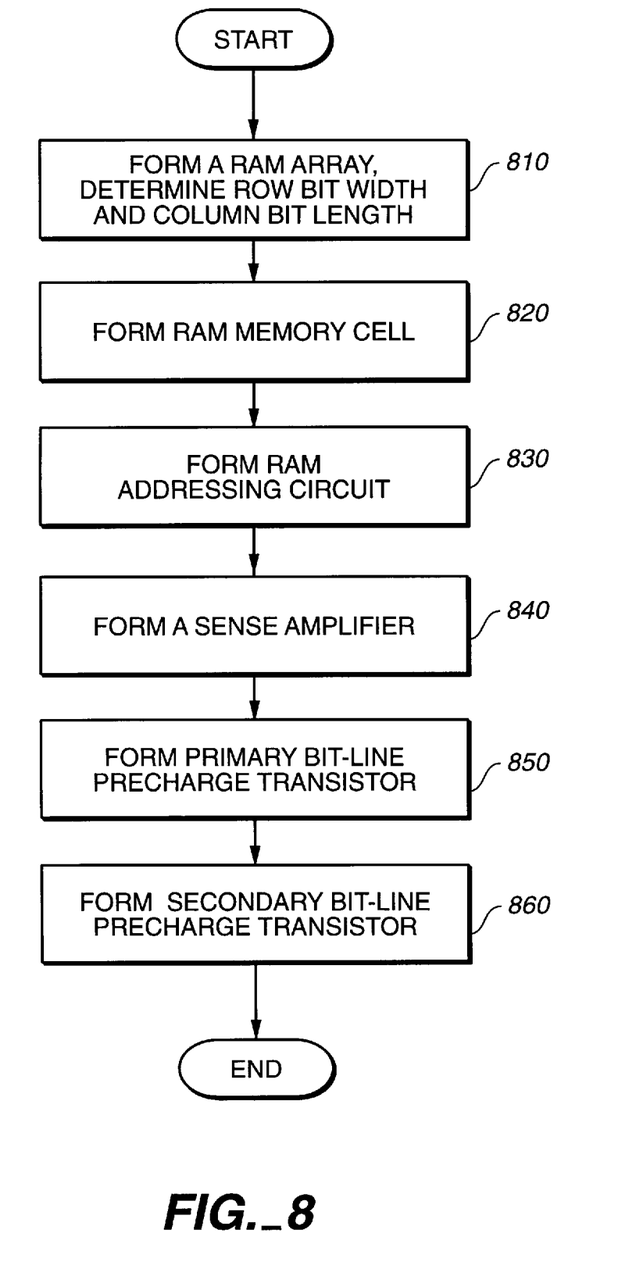
FIG. 8 is a flow chart illustrating the process steps of designing a RAM device incorporating the precharge circuit according to the preferred embodiment of the invention.

The present invention is also directed to techniques for making and using a selective precharge low power RAM, preferred components of which are described hereinabove with reference to FIGS. 6, 7, and 10A–10G. FIG. 8 is a flow chart illustrating steps of the preferred method for designing a selective precharge low power RAM embodying selective precharge circuit 600. The process begins in step 810 by forming a RAM array, determined through the desired bit width of RAM row as well as the desired bit length of RAM column. In step 820, formation of the RAM memory cells is performed. Subsequently, in step 830, the RAM addressing circuit, including address latches and decoding logic are formed.

In step 840, the preferred sense amplifiers for performing the read operation are formed. Here, preferably, a sense amplifier is formed for each bit position of the unit data word to be supported by the RAM device. In step 850, the primary bit line precharge transistors are formed based on RAM operating speed, RAM bit line loading, and precharge voltage level. Of course, it is preferred that a primary precharge transistor is formed for each bit position of the unit data word.

Finally, in step 860, the dedicated secondary bit line precharge transistors, with transistor size approximately equal to ½₀ of the primary bit line precharge transistor, are formed using known fabrication techniques.

The foregoing descriptions of the specific preferred embodiment of the present invention have been presented for the purposes of illustration and description. They are not intended to be exhaustive or to limit the invention to the precise forms disclosed, and obviously many modifications and variations are possible in light of the above teaching. The embodiment was chosen and described in order to best explain the principles of the invention and its practical application, to thereby enable other skilled in the art to best utilize the invention and various embodiments with various alternatives, modifications and variations as are suited to the particular use contemplated. Thus, the invention described herein is intended to embrace all such alternatives, modifications, applications and variations as may fall within the spirit and scope of the appended claims.

What is claimed is:

1. A low-power RAM, comprising:

plural memory cell columns, each memory cell column including a bit line;

a column multiplexer including an input port in switchable communication with said memory cell column bit lines, a control port and an output port;

a column decoder in communication with the control port of said column multiplexer to control said column multiplexer to select a predetermined number of said memory cell column bit lines according to a received column address;

a primary precharge device in communication with the output port of said column multiplexer to precharge the selected memory cell column bit lines through said column multiplexer upon receipt of a precharge signal; and a timing means in communication with said memory cell columns and said primary precharge device to generate the precharge signal and isolate said memory cell columns from said memory cell column bit lines when the selected memory cell column bit lines are being precharged.

2. The RAM of claim 1, further comprising a sense amplifier in communication with the output port of said column multiplexer to sense and condition data present on the selected memory cell column bit lines.

3. The RAM of claim 2, wherein said primary precharge device precharges the selected memory cell column bit lines to a logic high level; and wherein said sense amplifier comprises:

a first inverter including an input terminal in communication with the output port of said column multiplexer and an output terminal;

a second inverter coupled to the output terminal of said first inverter to generate read data; and a pull down device coupled the input terminal of said first inverter and including a control terminal coupled to the output terminal of said first inverter to accelerate sensing of logic low level data asserted on the selected memory cell column bit lines.

4. The RAM of claim 1, further comprising a plurality of secondary precharge devices in communication with each memory cell column bit line and said timing means, each said second secondary precharge device responsive to the precharge signal and having a current path at least 10 times smaller than said primary precharge device to slowly precharge a corresponding memory cell column bit line.

5. The RAM of claim 1, wherein said primary precharge device includes plural primary precharge devices, each of said primary precharge devices corresponding to one of the selected memory cell column bit lines.

6. The RAM of claim 2, wherein said sense amplifier includes plural sense amplifiers, each of said sense amplifiers corresponding to one of the selected memory cell column bit lines.

7. The RAM of claim 6, wherein said sense amplifier includes plural sense amplifiers, each of said sense amplifiers corresponding to one of the selected memory cell column bit lines and one of said primary precharge devices.

8. A low-power RAM, comprising:

a matrix of RAM cells, each cell having an access port;

plurality of bit lines, each bit line being coupled to the access ports of a matrix column of said RAM cells;

a column multiplexer including an input port in switchable communication with said bit lines, a control port and an output port;

a column decoder in communication with the control port of said column multiplexer to control said column multiplexer to select a predetermined number of said bit lines according to a received column portion of an address;

a primary precharge device in communication with the output port of said column multiplexer to precharge the selected bit lines through said column multiplexer upon receipt of a precharge signal; and a row decoder in communication with the access ports of said RAM cells to selectively enable the access ports of a matrix row of said RAM cells responsive to a received row portion of the address and an access signal and in the absence of the precharge signal.

9. The RAM of claim 8, further comprising a sense amplifier in communication with the output port of said column multiplexer to sense and condition data present on the selected bit lines.

10. The RAM of claim 8, further comprising a plurality of secondary precharge devices in communication with each bit line, each said second secondary precharge device responsive to the precharge signal and having a current path at least 10 times smaller than said primary precharge device to slowly precharge a corresponding bit line.

11. The RAM of claim 8, wherein said primary precharge device includes plural primary precharge devices, each of said primary precharge devices corresponding to one of the selected bit lines.

12. The RAM of claim 9, wherein said sense amplifier includes plural sense amplifiers, each of said sense amplifiers corresponding to one of the selected bit lines.

13. The RAM of claim 11, wherein said sense amplifier includes plural sense amplifiers, each of said sense amplifiers corresponding to one of the selected bit lines and one of said primary precharge devices.

14. A low Power RAM, comprising:

a matrix of RAM cells, each cell having an access port;

plurality of bit lines, each bit line being coupled to the access ports of a matrix column of said RAM cells;

a column multiplexer including an input port in switchable communication with said bit lines, a control Port and an output port;

a column decoder in communication with the control port of said column multiplexer to control said column multiplexer to select a predetermined number of said bit lines according to a received column portion of an address;

a primary precharge device in communication with the output port of said column multiplexer to precharge the selected bit lines through said column multiplexer upon receipt of a precharge signal;

a row decoder in communication with the access ports of said RAM cells to selectively enable the access ports of a matrix row of said RAM cells responsive to a received row portion of the address and an access signal and in the absence of the precharge signal; and a sense amplifier in communication with the output port of said column multiplexer to sense and condition data present on the selected bit lines;

wherein said primary precharge device precharges the selected bit lines to a logic high level; and wherein said sense amplifier comprises:

a first inverter including an input terminal in communication with the output port of said column multiplexer and an output terminal;

a second inverter coupled to the output terminal of said first inverter to generate read data; and a pull down device coupled the input terminal of said first inverter and including a control terminal coupled to the output terminal of said first inverter to accelerate sensing of logic low level data asserted on the selected bit lines.

* * * * *

UNITED STATES PATENT AND TRADEMARK OFFICE
CERTIFICATE OF CORRECTION

PATENT NO.      : 5,828,610
DATED           : October 27, 1998
INVENTOR(S)     : Robert Rogers, et al.

It is certified that errors appear in the above identified patent and that said Letters Patent is hereby corrected as shown below:

Column 12, line 66, change "Power" to --power--.

Column 13, line 4, change "Port" to --port--.

Signed and Sealed this

Eighteenth Day of May, 1999

*Attest:*

Q. TODD DICKINSON

*Attesting Officer*   Acting Commissioner of Patents and Trademarks